(12) United States Patent
Shi et al.

(10) Patent No.: US 9,972,668 B2
(45) Date of Patent: May 15, 2018

(54) OLED DISPLAY DEVICE AND MANUFACTURE METHOD THEREOF

(71) Applicant: Shenzhen China Star Optoelectronics Technology Co., Ltd., Shenzhen, Guangdong (CN)

(72) Inventors: Longqiang Shi, Guangdong (CN); Yifan Wang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days. days.

(21) Appl. No.: 15/821,844

(22) Filed: Nov. 24, 2017

(65) Prior Publication Data

US 2018/0108719 A1    Apr. 19, 2018

Related U.S. Application Data

(62) Division of application No. 14/424,965, filed on Feb. 27, 2015.

(51) Int. Cl.
| | |
|---|---|
| H01L 27/32 | (2006.01) |
| H01L 51/00 | (2006.01) |
| H01L 51/52 | (2006.01) |
| H01L 51/56 | (2006.01) |

(52) U.S. Cl.
CPC ...... *H01L 27/3253* (2013.01); *H01L 27/3246* (2013.01); *H01L 27/3248* (2013.01); *H01L 51/0024* (2013.01); *H01L 51/5206* (2013.01); *H01L 51/5221* (2013.01); *H01L 51/56* (2013.01); *H01L 27/3262* (2013.01); *H01L 2227/323* (2013.01); *H01L 2251/301* (2013.01); *H01L 2251/308* (2013.01); *H01L 2251/558* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0160247 A1* | 8/2003 | Miyazawa | .......... | H01L 51/5262 257/79 |
| 2003/0201445 A1* | 10/2003 | Park | .................... | H01L 27/3253 257/79 |

* cited by examiner

*Primary Examiner* — Ratisha Mehta
(74) *Attorney, Agent, or Firm* — Andrew C. Cheng

(57) ABSTRACT

A method for manufacturing an OLED display device that includes pixel areas is provided. A first and a second substrates are provided. TFTs are arranged on the first substrate. A passivation layer is formed on the TFTs such that the passivation layer includes a concave area formed in a surface thereof to expose a part of a drain of each of the TFTs. A transparent anode is formed on the second substrate. Partition walls are arranged on the transparent anode to defined therebetween transmission holes respectively corresponding to the pixel areas. An organic layer is formed on the transparent anode and located in the transmission holes. A metal cathode is formed on the organic layer and the partition walls such that the metal cathode is receivable into the concave area and electrically engageable with the exposed part of the drain of each of the TFTs.

5 Claims, 4 Drawing Sheets step 1, forming a thin film transistor (101), comprising a gate (101a), a source metal layer (101b), a drain metal layer (101c) on a first substrate, wherein a thickness of the source metal layer (101b) is smaller than a thickness of the drain metal layer (101c);

step 2, forming a passivation layer (103) on the source metal layer (101b), the drain metal layer (101c) and the first substrate (100), and a concave area (101d) of the passivation layer (103) and a convex area (101e) adjacent to the concave area (101d) is formed by a formation process; wherein a bottom of the concave area (101d) is aligned with a top surface of the drain metal layer (101c) and higher than a top surface of the source metal layer (101b) to expose a part of the drain metal layer (101c);

step 3, forming a transparent anode (201) on a second substrate (200);

step 4, forming partition walls (202) on the transparent anode (201), and the partition walls (202) comprise a plurality of transmission holes (203) corresponding to all pixel areas;

step 5, forming an organic layer (204) in the transmission holes (203) on the transparent anode (201);

step 6, forming a metal cathode (205) on the organic layer (204) and the partition walls (202);

step 7, laminating the first substrate (100) and the second substrate (200), and the metal anode (205) on the organic layer (204) correspondingly joints into the concave area (101d) and fits the bottom of the concave area (101d), and the metal cathode (205) is connected to the drain metal layer (101c) via the concave area (101d).

Fig. 3

OLED DISPLAY DEVICE AND MANUFACTURE METHOD THEREOF

CROSS REFERENCE TO RELATED APPLICATIONS

This is a divisional application of co-pending patent application Ser. No. 14/424,965, filed on Feb. 27, 2015, which is a national stage of PCT Application Number PCT/CN2015/072506, filed on Feb. 9, 2015, claiming foreign priority of Chinese Patent Application Number 201410742800.0, filed on Dec. 8, 2014.

FIELD OF THE INVENTION

The present invention relates to the field of display technology, and more particularly to an organic light emitting diode (OLED) display device and a manufacture method thereof.

BACKGROUND OF THE INVENTION

Organic light emitting diode (OLED) is a flat panel display technology, which has great prospects for development. It possesses not only extremely excellent display performance but also properties of self-illumination, simple structure, being ultra thin, fast response speed, wide view angle, low power consumption and capability of realizing flexible displaying, and is therefore considered as a "dream display". It has been favored by all large display makers and has become the main selection of the third generation displays.

The OLED display generally comprises a substrate, an anode located on the substrate, an organic emitting layer located on the anode, an electron transport layer located on the organic emitting layer, and a cathode located on the electron transport layer. During operation, holes from the anode and electrons from the cathode are injected into the organic emitting layer. The electrons and holes are combined to generate excited electron-hole pairs, and the excited electron-hole pairs are converted from an excited state to a ground state for achieving illumination.

The OLED can be categorized as passive matrix OLED (PMOLED) and active matrix OLED (AMOLED) according to driving type. The power consumption of the PMOLED is high, and thus, it hinders the application in large-scale display devices. Besides, in PMOLED, the aperture ratio is decreased along with the amount of wirings increased. Therefore, the PMOLED is generally applied for the small-scale display devices. The lighting efficiency of the AMOLED is high, and therefore, it is generally utilized for the large-scale display devices of high resolution.

On the other hand, the AMOLEDs can be categorized into bottom emitting AMOLED display devices and top emitting AMOLED display devices according to the emitting direction of the light from the organic emitting layer.

Referring to FIG. 1, a sectional view of a prior art bottom emitting AMOLED display device is provided. As shown in FIG. 1, the AMOLED display device comprises a first substrate 10 and a second substrate 20, which are separated and oppositely face each other. A plurality of thin film transistors T and a plurality of first electrodes 31 are formed on an inner surface of the first substrate 10, wherein each of the first electrodes 31 is connected to one of the thin film transistors T, and an organic layer 32 is formed on the first electrodes 31 and the thin film transistors T, and second electrodes 33 are formed on the organic layer 32. The organic layer 32 emits three colors of light in each pixel P, including red light R, green light G and blue light B. The AMOLED display device further comprises: a dryer 21 formed on an inner surface of the second substrate 20 to remove moisture and air that possibly invade into a space between the first and second substrates 10, 20. Seal 12 is arranged between the first and second substrates 10, 20 and surrounds the first and second electrodes 31, 33, the organic layer 32, and the thin film transistors T for protecting these elements from external moisture and air.

In the bottom emitting AMOLED display device shown in FIG. 1, the light emitting therefrom passes through the bottom where the thin film transistors are formed, and this lowers the aperture ratio as compared with the top emitting AMOLED display device. On the other hands, the top emitting AMOLED display device possesses a high aperture ratio but the cathode is generally built on the organic layer so that choice of the material for manufacturing the cathode is restricted. Thus, the transmittance is restricted and display effect is degraded.

SUMMARY OF THE INVENTION

An objective of the present invention is to provide an organic light emitting diode (OLED) display device, which provides a top emitting mode that shows high transmittance and provides a high aperture ratio.

Another objective of the present invention is to provide a manufacture method of an OLED display device, which help improve yield and the productivity.

For realizing the aforesaid objectives, the present invention first provides an OLED display device, which comprises: a first substrate, a second substrate spaced from and opposite to the first substrate, a plurality of thin film transistors located on an inner surface of the first substrate, a transparent anode located on an inner surface of the second substrate, a plurality of partition walls located on the transparent anode, transmission holes formed among the partition walls, an organic layer located on the transparent anode and in the transmission holes, and a metal cathode located on the organic layer and the partition walls, wherein the metal cathode is electrically connected to a drain of the thin film transistor.

The thin film transistor comprises a gate, a source metal layer and a drain metal layer, wherein a thickness of the source metal layer is smaller than a thickness of the drain metal layer; a passivation layer is further located on the source metal layer, the drain metal layer and the first substrate, and the passivation layer comprises a concave area and a convex area adjacent to the concave area, and a bottom of the concave area is aligned with a top surface of the drain metal layer and higher than a top surface of the source metal layer to expose a part of the drain metal layer, and the metal anode on the organic layer correspondingly joints into the concave area and fits the bottom of the concave area, and the metal cathode is connected to the drain metal layer via the concave area.

A material of the transparent anode is indium tin oxide.

A material of the metal cathode is one of calcium, aluminum and magnesium.

The organic layer comprises a hole transporting layer contacting the transparent anode, an electron transport layer contacting the metal cathode and an emitting layer located between the hole transporting layer and the electron transport layer.

The present invention further provides a manufacture method of an OLED display device, which comprises the following steps:

Step 1, forming a thin film transistor, which comprises a gate, a source metal layer, a drain metal layer, on a first substrate, wherein a thickness of the source metal layer is smaller than a thickness of the drain metal layer;

Step 2, forming a passivation layer on the source metal layer, the drain metal layer and the first substrate, and applying a formation process to form a concave area and a convex area that is adjacent to the concave area on the passivation layer, wherein a bottom of the concave area is aligned with a top surface of the drain metal layer and higher than a top surface of the source metal layer to expose a part of the drain metal layer;

Step 3, forming a transparent anode on a second substrate;

Step 4, forming partition walls on the transparent anode, such that the partition walls comprise a plurality of transmission holes respectively corresponding to pixel areas;

Step 5, forming an organic layer in the transmission holes to be located on the transparent anode;

Step 6, forming a metal cathode on the organic layer and the partition walls; and Step 7, laminating the first substrate and the second substrate, such that the metal cathode on the organic layer corresponds to and joints into the concave area and fits to the bottom of the concave area and the metal cathode is connected to the drain metal layer via the concave area.

As manufacturing respective elements, the concave area of the passivation layer is designed to correspond, in position, to the metal cathode on the organic layer, and an area of the concave area is larger than or equal to an area of the metal cathode on the organic layer, and the metal cathode on the organic layer can be completely jointed in the concave area of the passivation layer when the first substrate and the second substrate are combined together.

In Step 3, a material of the transparent anode is indium tin oxide.

In Step 5, a material of the metal cathode is one of calcium, aluminum and magnesium.

In Step 5, the organic layer comprises a hole transporting layer contacting the transparent anode, an electron transport layer contacting the metal cathode and an emitting layer located between the hole transporting layer and the electron transport layer.

The present invention further provides an OLED display device, which comprises a first substrate, a second substrate spaced from and opposite to the first substrate, a plurality of thin film transistors located on an inner surface of the first substrate, a transparent anode located on an inner surface of the second substrate, a plurality of partition walls located on the transparent anode, transmission holes formed among the partition walls, an organic layer located on the transparent anode and in the transmission holes, and a metal cathode located on the organic layer and the partition walls, wherein the metal cathode is electrically connected to a drain of the thin film transistor.

wherein the thin film transistor comprises a gate, a source metal layer and a drain metal layer, wherein a thickness of the source metal layer is smaller than a thickness of the drain metal layer; a passivation layer is further located on the source metal layer, the drain metal layer and the first substrate, and the passivation layer comprises a concave area and a convex area adjacent to the concave area, and a bottom of the concave area is aligned with a top surface of the drain metal layer and higher than a top surface of the source metal layer to expose a part of the drain metal layer, and the metal anode on the organic layer correspondingly joints into the concave area and fits the bottom of the concave area, and the metal cathode is connected to the drain metal layer via the concave area; and wherein the organic layer comprises a hole transporting layer contacting the transparent anode, an electron transport layer contacting the metal cathode and an emitting layer located between the hole transporting layer and the electron transport layer.

The benefits of the present invention are that the present invention provides an OLED display device and a manufacture method thereof. By forming the thin film transistors on the first substrate, and forming the organic layer and transparent anode on the second substrate, the transparent anode is located on the metal cathode and transparent, therefore, the selection of the cathode material is not influenced. Thus, the OLED display device is a top emitting type with high transmittance and a high aperture ratio. The manufacture method of an OLED display device provided by the present invention can manufacture an OLED display device with a high aperture ratio and high transmittance, and promote the yield and the productivity.

In order to better understand the characteristics and technical aspect of the invention, reference is made to the following detailed description of the present invention in combination with the drawings; however, the drawings are provided for reference and illustration only and are not intended to limiting of the invention.

BRIEF DESCRIPTION OF THE DRAWINGS

The technical solution and the beneficial effects of the present invention are best understood from the following detailed description with reference to the accompanying figures and embodiments.

In drawings,

FIG. 3 is a flowchart of a manufacture method of an OLED display device according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
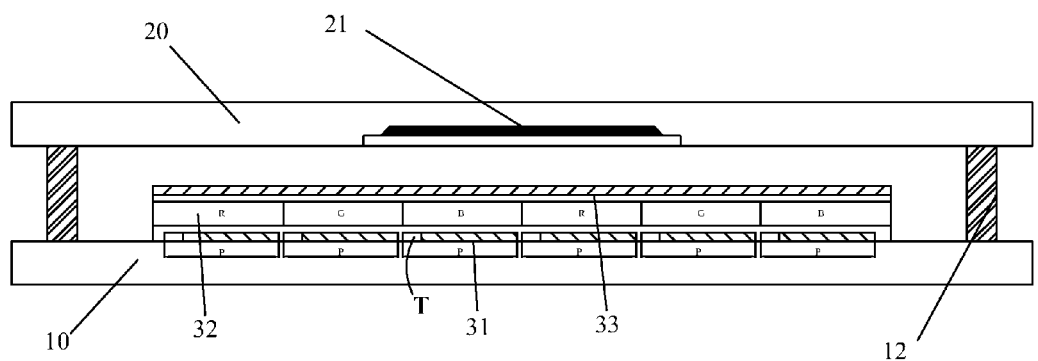
FIG. 1 is a sectional diagram of a prior art bottom emitting AMOLED display device.
Figure 2:
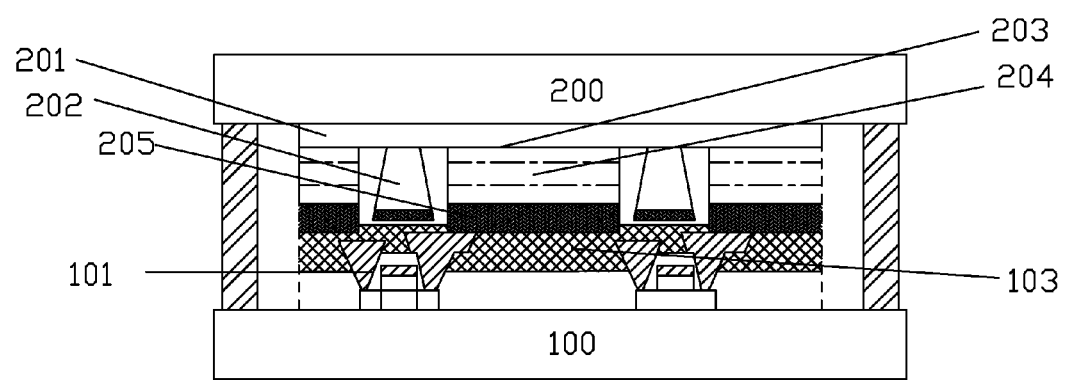
FIG. 2 is a sectional diagram of an OLED display device according to the present invention.
Figure 4:
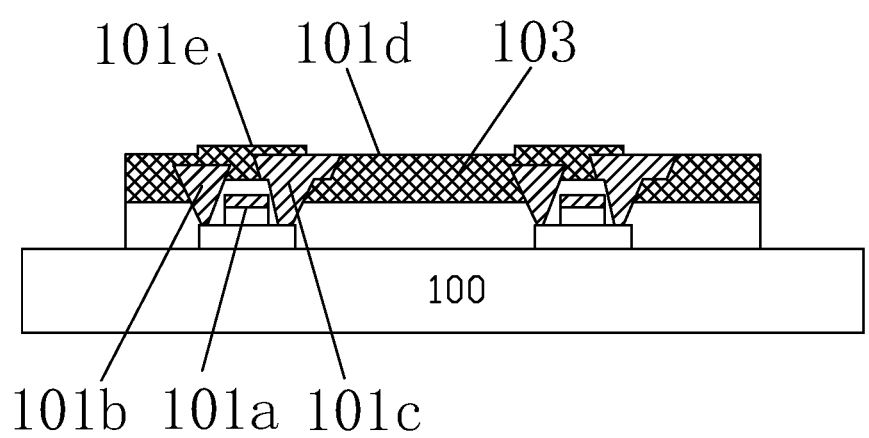
FIG. 4 is a sectional diagram of a thin film transistor and a passivation layer according to the present invention.

Referring to FIGS. 2 and 4, the present invention provides an organic light emitting diode (OLED display device, which comprises a first substrate 100, a second substrate 200 spaced from and opposite to the first substrate 100, a plurality of thin film transistors 101 located on an inner surface of the first substrate 100, a transparent anode 201 located on an inner surface of the second substrate 200, a plurality of partition walls 202 formed on the transparent anode 201, transmission holes 203 formed among the partition walls 202, an organic layer 204 located on the transparent anode 201 and in the transmission holes 203, and a metal cathode 205 located on the organic layer 204 and the partition walls 202, wherein the metal cathode 205 is electrically connected to drains of the thin film transistors 101.

The thin film transistor 101 comprises a gate 101a, a source metal layer 101b and a drain metal layer 101c, wherein a thickness of the source metal layer 101b is smaller than a thickness of the drain metal layer 101c. A passivation layer 103 is further formed on the source metal layer 101b, the drain metal layer 101c and the first substrate 100, and the passivation layer 103 comprises a concave area 101d and a convex area 101e adjacent to the concave area 101d, wherein a bottom of the concave area 101d is aligned with a top surface of the drain metal layer 101c and higher than a top surface of the source metal layer 101b to expose a part of the drain metal layer 101c. The metal cathode 205 located on the organic layer 204 corresponds to and joints into the concave area 101d and fits to the bottom of the concave area 101d, such that the metal cathode 205 is connected to the drain metal layer 101c via the concave area 101d.

Specifically, a contact width of the partition wall 202 with the transparent anode 201 is smaller than a contact width thereof with the metal cathode 205. A material of the transparent anode 201 is indium tin oxide. A material of the metal cathode 205 is one of calcium, aluminum and magnesium. The organic layer 204 comprises a hole transporting layer contacting the transparent anode 201, an electron transport layer contacting the metal cathode 205 and an emitting layer located between the hole transporting layer and the electron transport layer. A voltage between the transparent anode 201 and the metal cathode 205 is controlled according to a control signal received by the thin film transistor 101 to make the organic layer 204 illuminate. The emitting light goes out by passing through the transparent anode 201 or goes out by passing through the transparent anode 201 after being reflected by the metal cathode 205. Thus, the OLED display device of the present invention is a top emitting OLED display device with a specific high aperture ratio.

Referring to FIGS. 3 and 4, the present invention further provides a manufacture method of an OLED display device, which comprises the following steps:

Step 1, forming a thin film transistor 101, which comprises a gate 101a, an active layer, a source 101b and a drain 101c, on the first substrate 100.

A specific process of the step includes: forming a poly-silicon layer on the first substrate 100, wherein the poly-silicon layer comprises an active layer and a source area and a drain area located on two ends of the active layer; covering an insulative layer on the poly-silicon layer, wherein the insulative layer covers the entirety of the active layer, a part of the source area and a part of the drain area; and forming the gate 101a on the insulative layer of the active layer, and starting to coat metal layer on the exposed parts of the source area and the drain area to make the metal layer formed for forming the source metal layer 101b and the drain metal layer 101c, wherein a thickness of the source metal layer 101b is smaller than a thickness of the drain metal layer 101c.

Step 2, forming a passivation layer 103 on the source metal layer 101b, the drain metal layer 101c and the first substrate 100, and applying a formation process to form a concave area 101d on the passivation layer 103 and a convex area 101e adjacent to the concave area 101d, wherein a bottom of the concave area 101d is aligned with a top surface of the drain metal layer 101c and higher than a top surface of the source metal layer 101b to expose a part of the drain metal layer 101c.

Step 3, forming a transparent anode 201 on a second substrate 200.

In Step 3, a material of the transparent anode 201 is indium tin oxide.

Step 4, forming partition walls 202 on the transparent anode 201, such that the partition walls 202 comprise a plurality of transmission holes 203 respectively corresponding to pixel areas.

The partition walls 202 is formed of a material comprising an organic material or an inorganic material and is formed such that a bottom contact width of the partition wall 202 with the transparent anode 201 is larger than a top contact width thereof with the metal cathode 205.

Step 5, forming an organic layer 204 in the transmission holes 203 to be located on the transparent anode 201.

In Step 5, the organic layer 204 comprises a hole transporting layer contacting the transparent anode 201, an electron transport layer contacting the metal cathode 205 and an emitting layer located between the hole transporting layer and the electron transport layer. The organic layer 204 emits three colors of light including red, green and blue. A height of the organic layer 204 is lower than a height of the partition walls 202.

Step 6, forming a metal cathode 205 on the organic layer 204 and the partition walls 202.

In Step 6, a material of the metal cathode 205 is one of calcium, aluminum and magnesium.

Step 7, laminating the first substrate 100 and the second substrate 200, such that the metal cathode 205 formed on the organic layer 204 corresponds to and joints into the concave area 101d and fits to the bottom of the concave area 101d and the metal cathode 205 is connected to the drain metal layer 101c via the concave area 101d.

In manufacturing these elements, the concave area 101d of the passivation layer 103 is designed to correspond, in position, to the metal cathode 205 on the organic layer 204, and an area of the concave area 101d is larger than or equal to an area of the metal cathode 205 on the organic layer 204, and the metal cathode 205 on the organic layer 204 can be completely jointed in the concave area 101d of the passivation layer 103 when the first substrate and the second substrate are combined.

In the OLED display device and the manufacture method thereof provided by the present invention, by forming the thin film transistors on the first substrate, and forming the organic layer and transparent anode on the second substrate, the transparent anode is located on the metal cathode and transparent, therefore, the selection of the cathode material is not influenced. Thus, the OLED display device is a top emitting type with high transmittance and a high aperture ratio. The manufacture method of an OLED display device provided by the present invention can manufacture an OLED display device with a high aperture ratio and high transmittance, and promote the yield and the productivity.

The above provides only specific embodiments of the present invention, and the scope of the present invention is not limited to these embodiments. For those killed in the art, change or replacement, which is easily derived, should be covered by the protected scope of the invention. Thus, the protected scope of the invention should go by the subject claims.

What is claimed is:

1. A method for manufacturing an organic light emitting diode (OLED) display device that comprises a pixel area, comprising the following steps:

Step 1, forming a thin film transistor, which comprises a gate, a source metal layer, and a drain metal layer, on a first substrate, wherein a thickness of the source metal layer is smaller than a thickness of the drain metal layer;

Step 2, forming a passivation layer on the source metal layer, the drain metal layer, and the first substrate such that the passivation layer comprises a surface on which a concave area and a convex area that adjacent to the concave area are formed, wherein a bottom of the concave area is aligned with a top surface of the drain metal layer and higher than a top surface of the source metal layer to expose a part of the drain metal layer;

Step 3, forming a transparent anode on a second substrate;

Step 4, forming partition walls on the transparent anode, such that the partition walls define a transmission hole therebetween to correspond to the pixel area of the OLED display device;

Step 5, forming an organic layer in the transmission hole to be located on the transparent anode;

Step 6, forming a metal cathode on the organic layer and the partition walls; and Step 7, laminating the first substrate and the second substrate together, such that the metal cathode formed on the organic layer corresponds to and joints into the concave area and fits to the bottom of the concave area to have the metal cathode connected to the exposed part of the drain metal layer in the concave area.

2. The method as claimed in claim 1, wherein the concave area of the passivation layer corresponds, in position, to the metal cathode formed on the organic layer, and an area of the concave area is larger than or equal to an area of the metal cathode formed on the organic layer to allow the metal cathode to be completely received into and fit to the bottom of the concave area of the passivation layer to contact the exposed part of the drain metal layer.

3. The method as claimed in claim 1, wherein the transparent anode is formed of a material comprising indium tin oxide.

4. The method as claimed in claim 1, wherein the metal cathode is formed of a material comprising one of calcium, aluminum, and magnesium.

5. The method as claimed in claim 1, wherein the organic layer comprises a hole transporting layer that is in contact with the transparent anode, an electron transport layer that is in contact with the metal cathode, and an emitting layer located between the hole transporting layer and the electron transport layer.

\* \* \* \* \*